US009281438B2

(12) United States Patent
Hatakeyama et al.

(10) Patent No.: US 9,281,438 B2
(45) Date of Patent: Mar. 8, 2016

(54) PROCESS FOR PRODUCING GROUP III ELEMENT NITRIDE CRYSTAL AND APPARATUS FOR PRODUCING GROUP III ELEMENT NITRIDE CRYSTAL

(75) Inventors: Takeshi Hatakeyama, Ehime (JP); Hisashi Minemoto, Osaka (JP); Kouichi Hiranaka, Ehime (JP); Osamu Yamada, Ehime (JP)

(73) Assignee: RICOH COMPANY, LTD., Tokyo (JP)

( * ) Notice: Subject to any disclaimer, the term of this patent is extended or adjusted under 35 U.S.C. 154(b) by 1371 days.

(21) Appl. No.: 12/679,372

(22) PCT Filed: Sep. 26, 2008

(86) PCT No.: PCT/JP2008/002674
§ 371 (c)(1),
(2), (4) Date: Mar. 22, 2010

(87) PCT Pub. No.: WO2009/041053
PCT Pub. Date: Apr. 2, 2009

(65) Prior Publication Data
US 2010/0192839 A1 Aug. 5, 2010

(30) Foreign Application Priority Data

Sep. 28, 2007 (JP) ................................. 2007-252796

(51) Int. Cl.
*C30B 19/02* (2006.01)
*H01L 33/00* (2010.01)
(Continued)

(52) U.S. Cl.
CPC .............. *H01L 33/0075* (2013.01); *C30B 9/10* (2013.01); *C30B 19/02* (2013.01); *C30B 29/403* (2013.01);
(Continued)

(58) Field of Classification Search
CPC ............ C30B 9/00; C30B 9/10; C30B 19/02; C30B 29/403; C30B 29/406
USPC ............................ 117/54, 64, 68, 73, 77, 952
See application file for complete search history.

(56) References Cited

U.S. PATENT DOCUMENTS 4,330,361 A * 5/1982 Kuhn-Kuhnenfeld et al. . 117/30
5,868,837 A * 2/1999 DiSalvo et al. ................... 117/2
(Continued)

FOREIGN PATENT DOCUMENTS

JP 61-178493 A * 8/1986 .............. C30B 19/06
JP 2002-293696 10/2002
(Continued)

OTHER PUBLICATIONS

Japan Patent Office Advanced Industrial Property Network, English Computer translation of JP 2006-131454 A (2013).*
(Continued)

*Primary Examiner* — Matthew Song
(74) *Attorney, Agent, or Firm* — Cooper & Dunham LLP

(57) ABSTRACT

A group III element nitride single crystal is grown on a template immersed in a raw material liquid retained in a crucible and containing a group III material and one of an alkali metal and an alkali earth metal. The raw material liquid remaining after the growth of the single crystal is cooled and solidified, and by feeding a hydroxyl group-containing solution into the crucible, the solidified raw material is removed from around the template, and thus the group III element nitride single crystal is taken out from inside the solidified raw material. The template is disposed at a position away from the bottom of the crucible.

6 Claims, 14 Drawing Sheets

(51) Int. Cl.
*C30B 9/10* (2006.01)
*C30B 29/40* (2006.01)
*H01L 21/02* (2006.01)

(52) U.S. Cl.
CPC .......... *C30B 29/406* (2013.01); *H01L 21/0254* (2013.01); *H01L 21/02458* (2013.01); *H01L 21/02625* (2013.01); *H01L 21/0242* (2013.01); *Y10T 117/1024* (2015.01)

(56) References Cited

U.S. PATENT DOCUMENTS 6,533,838 B1 * 3/2003 Yamamura et al. ............. 75/688
2005/0098090 A1 * 5/2005 Hirota et al. .................. 117/2
2007/0215035 A1 9/2007 Kitaoka et al.

FOREIGN PATENT DOCUMENTS

| | | |
|---|---|---|
| JP | 2005-263622 | 9/2005 |
| JP | 2006-131454 | 5/2006 |
| JP | 2008-297153 | 12/2008 |

OTHER PUBLICATIONS

International Search Report of PCT/JP2008/002674, dated Dec. 22, 2008.

\* cited by examiner

PROCESS FOR PRODUCING GROUP III ELEMENT NITRIDE CRYSTAL AND APPARATUS FOR PRODUCING GROUP III ELEMENT NITRIDE CRYSTAL

TECHNICAL FIELD

The present invention relates to a process for producing a group III element nitride crystal and an apparatus for producing a group III element nitride crystal.

BACKGROUND ART

Among compound semiconductors, group III element nitrides (hereinafter, referred to as group III nitrides or group III nitride semiconductors, as the case may be) such as gallium nitride (GaN) are attracting attention as the materials for blue light or ultraviolet light-emitting semiconductor elements. Blue laser diodes (LDs) are applied to high-density optical discs or high-density displays, and blue light-emitting diodes (LEDs) are applied to displays or illumination. Ultraviolet LDs are expected to be applied to biotechnology and the like, and ultraviolet LEDs are expected to be applied as ultraviolet light sources for fluorescent lamps.

The substrates made of the group III nitride semiconductors (such as GaN) for use in LDs and LEDs are usually formed on sapphire substrates by heteroepitaxially growing group III nitride single crystals with vapor phase epitaxial growth methods. Examples of the vapor phase growth methods include the metal organic chemical vapor deposition method (MOCVD method), the hydride vapor phase epitaxy method (HVPE method) and the molecular beam epitaxy method (MBE method).

Alternatively, instead of vapor phase epitaxial growth, methods for growing crystals in liquid phase have also been investigated. The nitrogen equilibrium vapor pressure at the melting point of the single crystal of a group III nitride such as GaN or AlN is ten thousands atm or more. Accordingly, it is generally accepted that, for the purpose of growing gallium nitride in the liquid phase, known techniques require the conditions set at 1200° C. and 8000 atm (8000×1.01325×10$^5$ Pa). In contrast, recently it has been shown that the use of an alkali metal such as Na enables the synthesis of GaN at a relatively low temperature of 750° C. and a relatively low pressure of 50 atm (50×1.01325×10$^5$ Pa).

Recently, in an ammonium-containing nitrogen gas atmosphere, a mixture composed of Ga and Na was melted at 800° C. and 50 atm (50×1.01325×10$^5$ Pa), and single crystals having a maximum crystal size of 1.2 mm have been obtained by using the resulting molten liquid, with a growth time of 96 hours (for example, JP2002-293696A).

There has also been proposed a method in which after a GaN crystal layer is formed as a film on a sapphire substrate with the metal organic chemical vapor deposition (MOCVD) method, a single crystal is grown with the liquid phase epitaxy (LPE) method (for example, JP2005-263622A).

FIG. 15 shows a schematic configuration of a known production apparatus for growing a GaN crystal with the liquid phase epitaxy method. Reference numeral 100 denotes a heating growth furnace, in the interior of which an air-tight pressure-resistant heat-resistant vessel 103 is disposed. Reference numeral 104 denotes a lid of the vessel 103. Reference numeral 101 denotes a raw material gas feeder for feeding a raw material gas 109, namely, nitrogen gas, and the raw material gas feeder 101 is connected to the pressure-resistant heat-resistant vessel 103 through a connecting pipe 114. The connecting pipe 114 is equipped with a pressure regulator 102, a leak valve 106, a joint 108 and a stop valve 105. The growth furnace 100 is constructed as an electric furnace equipped with a heat insulator 111 and a heater 112, and the temperature of the growth furnace 100 is controlled with a thermocouple 113. The growth furnace 100 as a whole is capable of being swung about a horizontal shaft center A.

Inside the pressure-resistant heat-resistant vessel 103, a crucible 107 is disposed. A high-temperature raw material liquid 110 is held inside the crucible 107, and a template 201 is immersed in the raw material liquid 110. The template 201 is prepared by forming as film a semiconductor layer composed of GaN on a sapphire substrate and is used as a seed crystal. The template 201 is prepared by supplying trimethyl gallium (TMG) and ammonia (NH$_3$) onto a sapphire substrate having been heated so as to reach 1020° C. to 1100° C. The raw material liquid 110 is a molten substance prepared by melting metallic gallium and Na as raw materials at a high temperature.

When a crystal is produced in the production apparatus having such a configuration as described above, first in the outside of the production apparatus, the template 201 is disposed in the crucible 107 so as to lie along and to be oriented parallel to the bottom of the crucible 107. Further, metallic gallium and Na as the raw materials are weighed to predetermined amounts and set in the crucible 107.

Then, the crucible 107 is inserted into the air-tight pressure-resistant heat-resistant vessel 103, and the pressure-resistant heat-resistant vessel 103 is set in the growth furnace 100 and connected to the raw material gas feeder 101 through the connecting pipe 114. The growth temperature is set at 850° C. and the nitrogen atmosphere pressure is set at 50 atm (50×1.01325×10$^5$ Pa), and while the growth furnace 100 is being swung about the shaft center A, nitrogen gas is dissolved in the Ga/Na molten liquid as the raw material liquid 110 to grow the GaN single crystal on the template 201.

On completion of the growth of the GaN single crystal, the raw material liquid 110 is cooled and solidified in the pressure-resistant heat-resistant vessel 103. Then, the crucible 107 is taken out from the pressure-resistant heat-resistant vessel, the raw material cooled and solidified in the crucible 107 is subjected to a dissolution treatment with ethanol or the like, and the template 201 with the GaN single crystal grown thereon is taken out.

DISCLOSURE OF THE INVENTION

Problems to be Solved by the Invention

However, while the cooled and solidified raw material is being treated with ethanol or the like after the growth of the GaN single crystal, the raw material liquid gets into and is solidified in the clearance between the template 201 and the bottom of the crucible 107 because the template 201 is disposed so as to lie along and to be oriented parallel to the bottom of the crucible 107 as described above. The solidified raw material in such a clearance is hardly treated even with an ultrasonic device and hence requires a long time for the treatment thereof, and thus disadvantageously it takes a long time to take out the crystal.

Following the treatment of the solidified raw material, hydrogen gas is generated. The generated hydrogen gas is accumulated between the template 201 and the bottom of the crucible 107, and exerts pressure to the template 201 from beneath the template 201. Consequently, an upward stress is generated in the template 201, and the stress causes a distortion in the GaN single crystal; when the distortion is large, the cracking of the GaN single crystal occurs.

In view of the above-described problems, an object of the present invention is to provide a process for producing a group III element nitride crystal which process enables, after the group III element nitride crystal such as a GaN single crystal is grown in the high-temperature raw material liquid, the taking out of the crystal from inside the cooled and solidified raw material in a short time in a manner suppressing the cracking of the crystal.

Means for Solving the Problems

For the purpose of solving the above-described problems, the production process of the present invention is a process wherein: a template, a group III element material and one of an alkali metal and an alkali earth metal are placed in a crucible, and a raw material gas is fed into the crucible; by heating the interior of the crucible, the group III element material and one of the alkali metal and the alkali earth metal are liquefied to produce a raw material liquid, and the template is immersed in the raw material liquid; the raw material liquid and the raw material gas are reacted with each other to grow a group III element nitride single crystal on the template in the raw material liquid; the raw material liquid remaining after the growth of the single crystal is cooled and solidified to be a solidified raw material; and by feeding a hydroxyl group-containing solution into the crucible containing the solidified raw material, the solidified raw material is removed from around the template, and thus the group III element nitride single crystal is taken out from inside the solidified raw material, wherein said process comprises disposing the template at a position away from the bottom of the crucible.

According to the above-described process, the template is disposed at a position away from the bottom of the crucible, and hence after the treatment with a hydroxyl group-containing solution progresses to some extent, the amount of the solidified raw material remaining between the template and the bottom of the crucible is an amount corresponding to the position of the template disposed away from the bottom of the crucible. As compared to the case where the template is disposed directly on the bottom of the crucible as in known techniques, the remaining solidified raw material is larger in the area in contact with the hydroxyl group-containing solution, and hence the treatment with the hydroxyl group-containing solution is performed rapidly. As compared to known techniques, the separation between the template and the bottom of the crucible is wider, and hence the hydrogen gas generated following the treatment escapes easily and the cracking of the single crystal on the template hardly tends to occur.

For the purpose of disposing the template at a position away from the bottom of the crucible, the template is preferably supported with protrusions formed on the bottom of the crucible, or the template is preferably supported with a spacer disposed between the bottom of the crucible and the template.

The template is preferably supported so as to take a position parallel to the bottom of the crucible. Specifically, the template is preferably disposed at a position away from the bottom of the crucible by 1 mm or more.

Advantages of the Invention

According to the present invention, by disposing the template at a position away from the bottom of the crucible, after the group III element nitride crystal is grown on the template, the crystal can be taken out from inside the solidified raw material in a short time and in a manner suppressing the cracking of the crystal.

BEST MODE FOR CARRYING OUT THE INVENTION

Hereinafter, the embodiments of the present invention are described with reference to the accompanying drawings.

Embodiment 1

Figure 1:
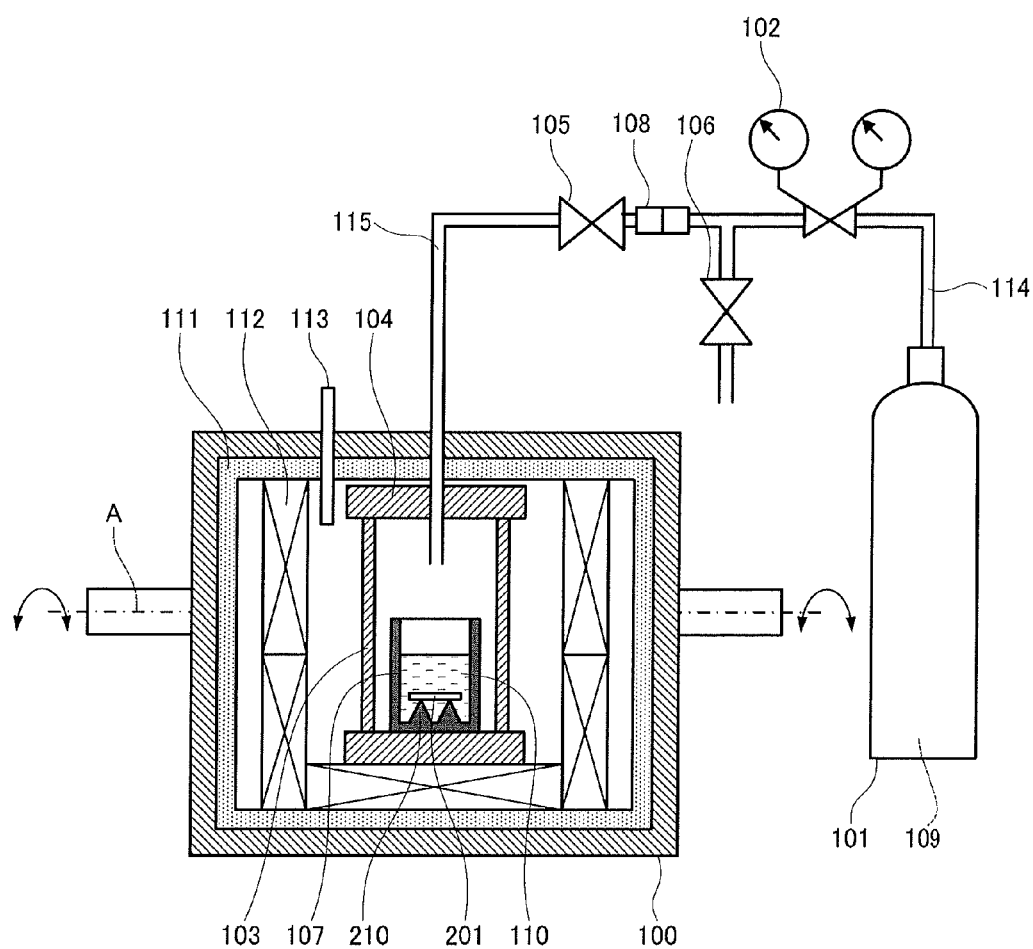
FIG. 1 is a view illustrating a schematic configuration of the apparatus for embodying the process for producing a group III element nitride single crystal of the embodiment 1 of the present invention.

FIG. 1 illustrates a schematic configuration of the apparatus for producing a group III element nitride crystal in the embodiment 1 of the present invention.

Reference numeral 100 denotes a heating growth furnace, in the interior of which an air-tight pressure-resistant heat-resistant vessel 103 is disposed. Reference numeral 104 denotes a lid of the vessel 103. Reference numeral 101 denotes a raw material gas feeder for feeding the raw material gas, namely, nitrogen gas, and the raw material gas feeder 101 is connected to the pressure-resistant heat-resistant vessel 103 through connecting pipes 114 and 115. The connecting pipe 114 and the connecting pipe 115 are communicatively connected to each other with a joint 108 in a manner separable from each other. The connecting pipe 114 is equipped with a pressure regulator 102 and a leak valve 106. The connecting pipe 115 is equipped with a stop valve 105.

The raw material gas feeder 101 is only required to be able to pressurize a raw material gas 109 at a predetermined pressure, and can control this pressure in a range from normal pressure ($1 \times 1.01325 \times 10^5$ Pa) to 100 atm ($100 \times 1.01325 \times 10^5$ Pa). The pressure regulator 102, the stop valve 105 and the leak valve 106 installed in the connecting pipes 114 and 115 are electrically linked to each other, and hence the pressure for feeding to the pressure-resistant heat-resistant vessel 103 can be maintained at a predetermined pressure. As the raw material gas 109, nitrogen gas, ammonia gas, a mixed gas composed of nitrogen gas and ammonia gas or the like is used.

The pressure-resistant heat-resistant vessel 103 is only required to be capable of housing in the inside thereof the crucible 107, and maintaining air-tightness at high temperatures and high pressures respectively falling in a range from normal temperature to 1100° C. and in a range from normal pressure ($1 \times 1.01325 \times 10^5$ Pa) to 100 atm ($100 \times 1.01325 \times 10^5$ Pa). Specifically, as the pressure-resistant heat-resistant vessel 103, there can be used a vessel produced by using a stainless steel material such as SUS 316 specified by JIS, or a high temperature-resistant and high pressure-resistant material such as Inconel, Hastelloy or Incolloy (these three are all registered trade marks). In particular, a material such as Inconel, Hastelloy or Incolloy also has a resistance to the oxidation at high temperatures under high pressures, can be used even in an atmosphere other than an inert gas, and hence is preferable from the viewpoints of recycling and durability.

The growth furnace 100 is constructed as an electric furnace equipped with a heat insulator 111 and a heater 112. As the heater 112, there can be used an induction heater (high frequency coil), a resistance heater (a heater using nichrome, kanthal, SiC, $MoSi_2$ or the like), or the like. Preferable among these is the induction heater, because the induction heater is small in generation of impurity gases at high temperatures. The growth furnace 100 is equipped with the thermocouple 113 for the temperature control and the like, and is designed to be controllable in temperature in a range from normal temperature to 1100° C. This is because it is preferable, from the viewpoint of preventing the "agglomeration" of the raw material liquid 110 in the crucible 107, to control the temperature of the pressure-resistant heat-resistant vessel 103 in such a way that the temperature of the pressure-resistant heat-resistant vessel 103 is uniformly maintained. The growth furnace 100 is equipped with a pressure regulator (not shown) for regulating the atmospheric pressure in the furnace, and the atmospheric pressure in the furnace can be controlled in a range of 100 atm ($100 \times 1.01325 \times 10^5$ Pa) or less. For the purpose of stirring the raw material liquid 110 in the crucible 107, the growth furnace 100 as a whole is capable of being swung about a horizontal shaft center A. Also for the purpose of stirring the raw material liquid 110, the upper section and the lower section of the growth furnace 100 are made different in temperature from each other to enable the thermal convention to be generated in the raw material liquid 110.

For the crucible 107, there can be used materials hardly reactive with the group III elements and the alkali metals, such as alumina ($Al_2O_3$), sapphire ($Al_2{}^O{}_3$), yttria ($Y_2O_3$), magnesium oxide (MgO), calcium oxide (CaO), boron nitride (BN) and tungsten (W). In the crucible 107, a plurality of protrusions 210 are formed on the internal surface of the bottom, and hence the internal surface of the bottom of the crucible 107 has a protruded and recessed shape. The protrusions 210 are each only required to have a shape capable of supporting the template 201. Although here the protrusions 210 are simply drawn as ridge-shaped protrusions which are laterally aligned triangular prisms each having a triangular transverse cross section, the details of the shape of the protrusions are described below.

The template 201 is only required to be a member capable of functioning as a seed crystal of the group III element nitride crystal. Preferably, examples of such a member include: a template in which a semiconductor layer represented by a composition formula $Al_uGa_vIn_{1-u+v}N$ is formed on a substrate made of sapphire or the like; a template in which a single crystal represented by the same composition formula $Al_uGa_vIn_{1-u+v}N$ is formed on a substrate made of sapphire or the like; a template which is a self-supported semiconductor represented by the same composition formula $Al_uGa_vIn_{1-u+v}N$; and a template which is a single crystal represented by the same composition formula $Al_uGa_vIn_{1-u+v}N$. It is to be noted that in the composition formula, $0 \leq u \leq 1$, $0 \leq v \leq 1$, and $0 \leq u+v \leq 1$. It is also to be noted that the "template" as referred to in the present description means the templates described herein.

By using such a template 201 as described above as the seed crystal, a thick-film single crystal can be grown on the template 201, and a large-area single crystal can be easily grown.

The process for producing a group III element nitride single crystal by using the above-described production apparatus is described below.

Figure 2A:
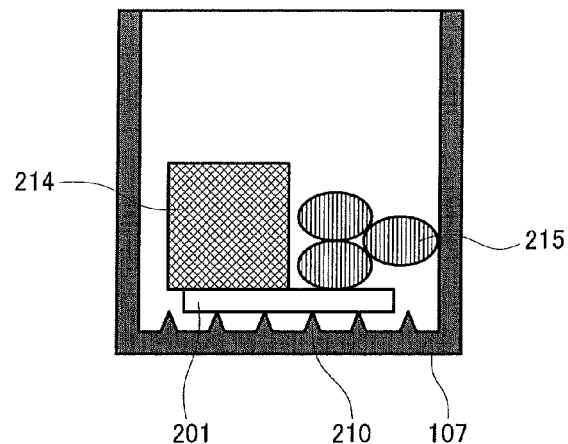
FIG. 2A is a view illustrating a part of the steps of the process for producing a group III element nitride single crystal of the embodiment 1.

As shown in FIG. 2A, a flat-plate template 201 is placed and held on the top of the protrusions 210 in the crucible 107 so as to take a position parallel to the bottom of the crucible 107.

Onto the template 201, a group III element material 215 and alkali metal 214 as raw materials are fed. As the group III element material 215, gallium, aluminum or indium can be used. As the alkali metal 214, lithium, sodium, potassium or the like can be used. In place of the alkali metal 214, an alkali earth metal such as calcium, strontium, barium, radium, beryllium or magnesium may also be used. These alkali metals 214 and alkali earth metals may be used each alone or in combinations of two or more thereof. The weighing and handling of the group III element material 215 and the alkali metal 214 are preferably performed in a glove box replaced with nitrogen gas, argon gas, neon gas or the like, for the purpose of avoiding the oxidation of the alkali metal 214 and moisture adsorption.

Figure 2B:
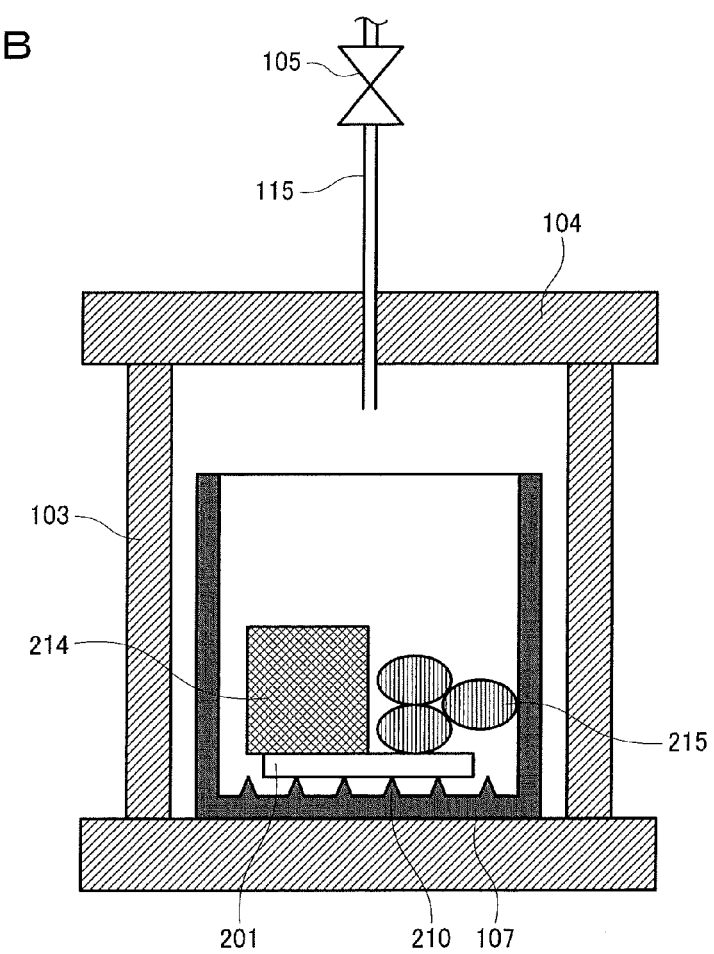
FIG. 2B is a view illustrating another part of the steps of the process for producing a group III element nitride single crystal of the embodiment 1.

Next, as shown in FIG. 2B, the crucible 107 is inserted into the pressure-resistant heat-resistant vessel 103, the lid 104 is closed, the stop valve 105, integrated with the lid 104, of the pipe 115 is closed, and the pressure-resistant heat-resistant vessel 103 is taken out as it is from the glove box.

Then, the pressure-resistant heat-resistant vessel 103 is fixed in the growth furnace 100 as shown in FIG. 1, the pipe 115 of the pressure-resistant heat-resistant vessel 103 is connected to the raw material gas feeder 101, the stop valve 105 is opened, and the raw material gas 109 is injected from the raw material gas feeder 101 into the pressure-resistant heat-resistant vessel 103. In this case, preferably the raw material gas 109 is injected and the air in the pressure-resistant heat-resistant vessel 103 is replaced with the raw material gas 109 after the interior of the pressure-resistant heat-resistant vessel 103 is evacuated to vacuum with a not-shown pump such as a rotary pump or a turbo pump.

Subsequently, while the temperature of the growth furnace 100 and the pressure of the growth atmosphere are being controlled with the thermocouple 113 and the pressure regulator 102, the growth of the group III element nitride single crystal is performed.

In this case, the interior of the growth furnace 100 is preferably filled with an inert gas such as argon gas, helium gas, neon gas or nitrogen gas. This is because when the pressure-resistant heat-resistant vessel 103 is maintained in air atmosphere at a high temperature, even the pressure-resistant heat-resistant vessel 103 itself is oxidized so as to be hardly reused.

The raw material melting conditions and the growth conditions for producing the group III element nitride single crystal are dependent on the component of the group III element material 215 and the component of the alkali metal 214 as raw materials, and the component and the pressure of the raw material gas. For example, as the temperature, relatively low temperatures of 700° C. to 1100° C. and preferably 700° C. to 900° C. are applied, and as the pressure, the pressures of 20 atm ($20 \times 1.01325 \times 10^5$ Pa) or more, and preferably 30 atm ($30 \times 1.01325 \times 10^5$ Pa) to 100 atm ($100 \times 1.01325 \times 10^5$ Pa) are applied.

By increasing the temperature to the growth temperature, the molten liquid of the group III element material 215/the alkali metal 214, namely, the above-described raw material liquid 110 are formed in the crucible 107. Then, the raw material gas 109 dissolves into the raw material liquid 110, the group III element material 215 and the raw material gas 109 react with each other, and thus the group III element nitride single crystal 216 is grown on the template 201 as shown in FIG. 3A.

The reasons for the fact that the template 201 is disposed so as to be parallel to the bottom of the crucible 107 as described above are such that, as shown in FIG. 3A, consequently the distance to the surface of the raw material liquid 110 is uniform over the entire surface of the template 201, and the dissolved amount of the raw material gas 109 into the raw material liquid 110 in the vicinity of the surface of the raw material liquid 110 comes to be uniform, so as to enable the uniform growth of the group III element nitride single crystal 216. The template 201 is not required to be perfectly parallel to, but may be approximately parallel to the bottom of the crucible 107.

Figure 3A:
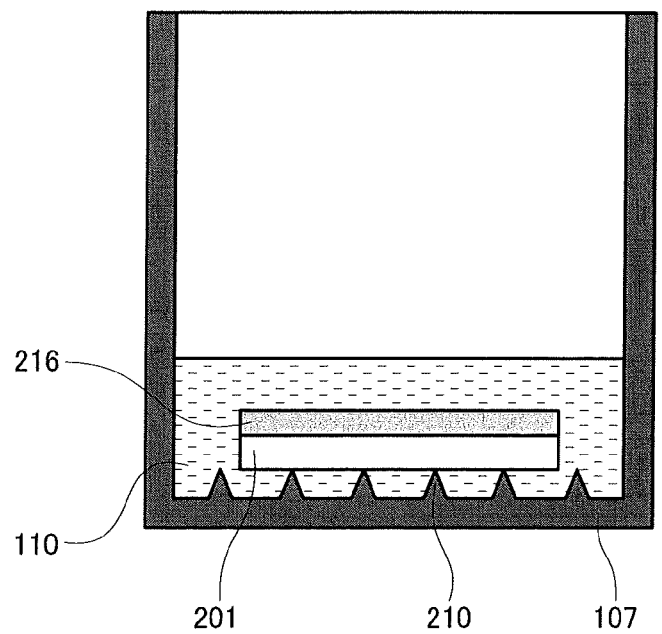
FIG. 3A is a view illustrating yet another part of the steps of the process for producing a group III element nitride single crystal of the embodiment 1.
Figure 3B:
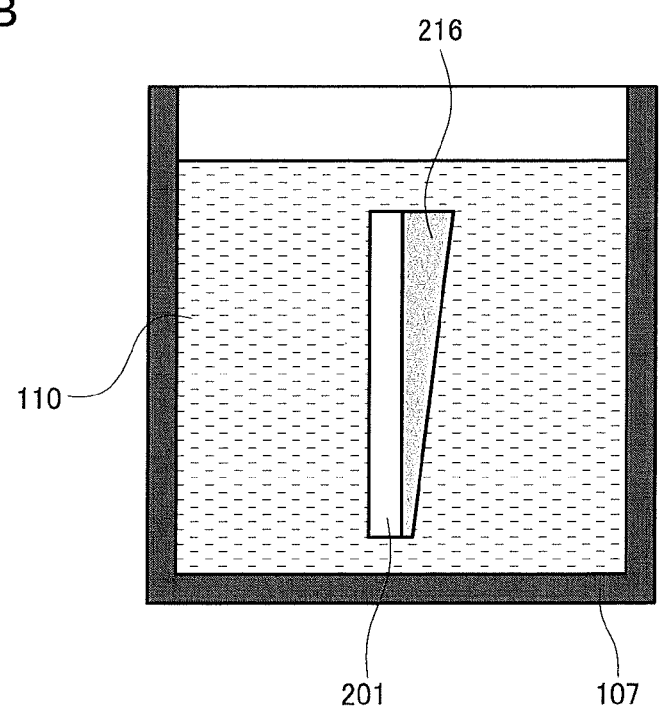
FIG. 3B is a view illustrating a production process other than the process for producing a group III element nitride single crystal of the embodiment 1.

On the other hand, when a case is considered where the template 201 is disposed so as to be perpendicular to the bottom of the crucible 107 as shown in FIG. 3B, the surface level of the raw material liquid 110 in the crucible 107 has to be made higher as compared to the case of FIG. 3A. Accordingly, the raw material gas 109 more easily dissolves into the upper portion, closer to the gas phase, of the raw material liquid 110, and on the other hand, the raw material gas 109 more hardly dissolves into the lower portion, far away from the gas phase, of the raw material liquid 110. Thus, the dissolved amount of the raw material gas 109 is different in the upper portion from in the lower portion of the raw material liquid 110. Consequently, the growth of the group III element nitride single crystal 216 is faster on the upper portion of the template 201 and slower on the lower portion of the template 201 to result in an uneven thickness of the group III element nitride single crystal 216 as shown in the figure.

After a predetermined time has elapsed and the growth of the group III element nitride single crystal 216 has been completed, the raw material liquid 110 is cooled and solidified in the growth furnace 100 and the pressure-resistant heat-resistant vessel 103. Then, the crucible 107 is taken out from the growth furnace 100 and the pressure-resistant heat-resistant vessel 103. The template 201 with the group III element nitride single crystal 216 integrally formed thereon is embedded inside the cooled and solidified raw material in the crucible 107. Therefore, the solidified raw material is treated for the purpose of taking out the template 201 with the group III element nitride single crystal 216 integrally formed thereon from inside the cooled and solidified raw material.

In the raw material liquid 110 after the growth, namely, in the solidified raw material, the group III element material 215 shown in either of FIG. 2A and FIG. 2B remains in about 5 to 30% of the original amount. Most of the solidified raw material is composed of the alkali metal 214. Accordingly, a hydroxyl group (—OH)-containing optional solution such an alcohol such as ethanol, methanol or isopropyl alcohol, or water is injected into the crucible 107. Thus, the solidified raw material is immersed into the solution, and the metal alkoxide (when water is used, the metal hydroxide) dissolved in the injected solution and hydrogen are produced. In this way, the solidified raw material is removed from around the template 201 with the group III element nitride single crystal 216 integrally formed thereon.

Figure 4:
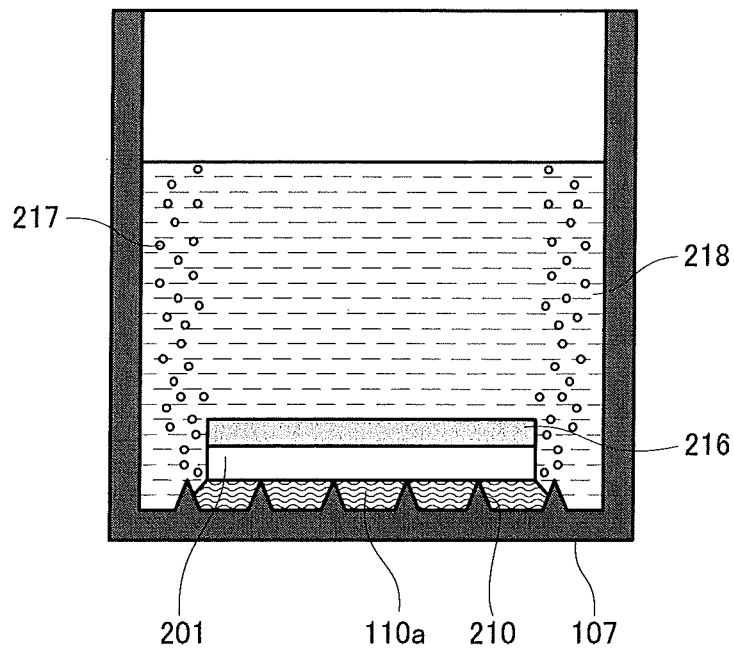
FIG. 4 is a view illustrating still yet another part of the steps of the process for producing a group III element nitride single crystal of the embodiment 1.
Figure 5A:
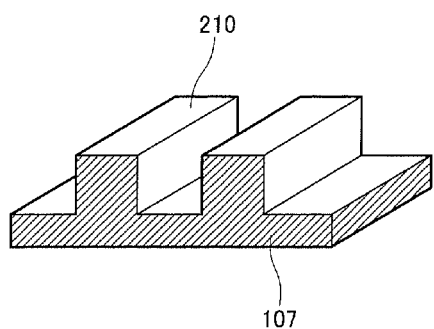
FIG. 5A is a schematic view illustrating a bottom shape of a crucible usable in the process for producing a group III element nitride single crystal of the embodiment 1.
Figure 5B:
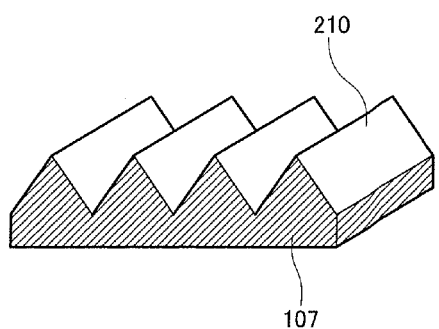
FIG. 5B is a schematic view illustrating another bottom shape of a crucible usable in the process for producing a group III element nitride single crystal of the embodiment 1.
Figure 5C:
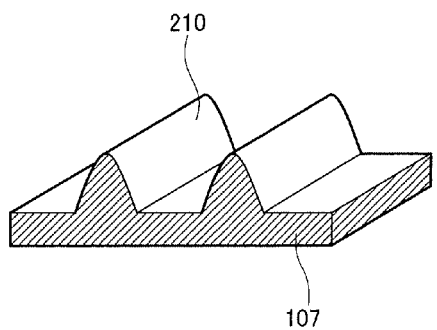
FIG. 5C is a schematic view illustrating yet another bottom shape of a crucible usable in the process for producing a group III element nitride single crystal of the embodiment 1.
Figure 5D:
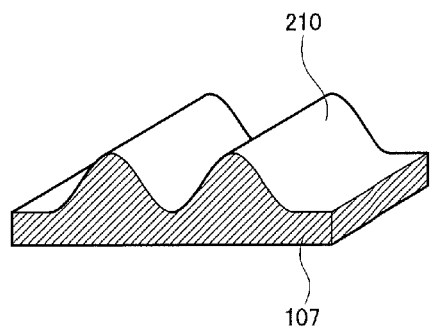
FIG. 5D is a schematic view illustrating still yet another bottom shape of a crucible usable in the process for producing a group III element nitride single crystal of the embodiment 1.

In this case, the solidified raw material above and around the template 201 disposed parallel to the bottom of the crucible 107 can be relatively rapidly treated. On the other hand, it is generally difficult to treat the solidified raw material due to the solidification of the raw material liquid 110 having gotten into under the template 201. However, when the crucible 107 having protrusions and recesses on the bottom thereof is used as described above and the template 201 is disposed on the protrusions 210, the solidified raw material 110a under the template 201 remains to such an extent corresponding to the height of the protrusions 210 as shown in FIG. 4.

The thus remaining solidified raw material 110a is more satisfactorily brought into contact with the treatment solution such as ethanol 218 as compared to the case where a template is disposed in a crucible 107 having neither protrusions nor recesses on the bottom thereof as in the case of known techniques, and accordingly the treatment of the remaining solidified raw material 110a can be performed rapidly. Additionally, the separation between the template 201 and the bottom of the crucible 107 is wider, and hence the hydrogen gas 217 generated due to the treatment easily escapes. Accordingly, the cracking of the group III element nitride single crystal 216 on the template 201 due to the retention of the hydrogen gas 217 is made difficult to occur.

When the ethanol 218 and the solidified raw material 110a are at high temperatures, a severe reaction occurs, and hence it is preferable to perform this treatment at normal temperature to about 50° C. After the completion of the treatment of the solidified raw material 110a, the template 201 with the group III element nitride single crystal 216 integrally formed thereon is taken out.

The details of the protruded and recessed shape of the bottom in the crucible 107 are described. The protrusions 210 are only required to have a shape capable of supporting the template 201; as shown in FIGS. 1 to 4, the protrusions may be laterally aligned triangular prisms, namely, a plurality of ridge-shaped protrusions aligned and disposed with appropriate separations therebetween. Alternatively, as schematically shown in FIGS. 5A to 5D, the protrusions may be laterally aligned square prisms (FIG. 5A), laterally aligned triangular prisms with no separation therebetween (FIG. 5B), laterally aligned semicircular columns and protrusions with a wave-shaped transverse cross section (FIGS. 5C and 5D, respectively) or the like.

Figure 6A:
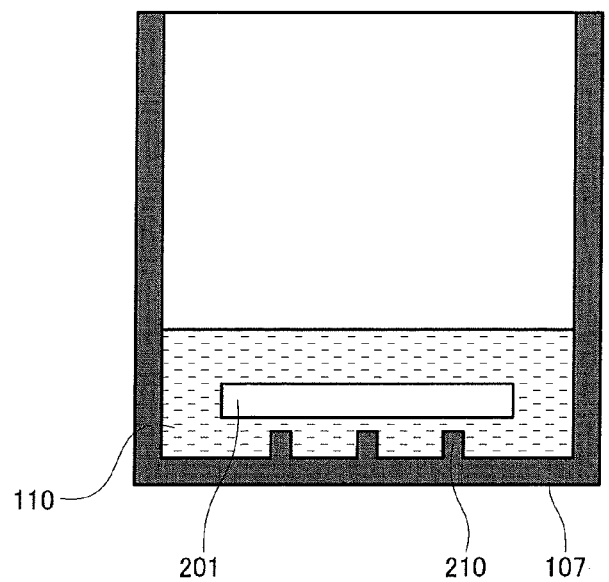
FIG. 6A is a sectional view illustrating further still yet another bottom shape of a crucible usable in the process for producing a group III element nitride single crystal of the embodiment 1.
Figure 6B:
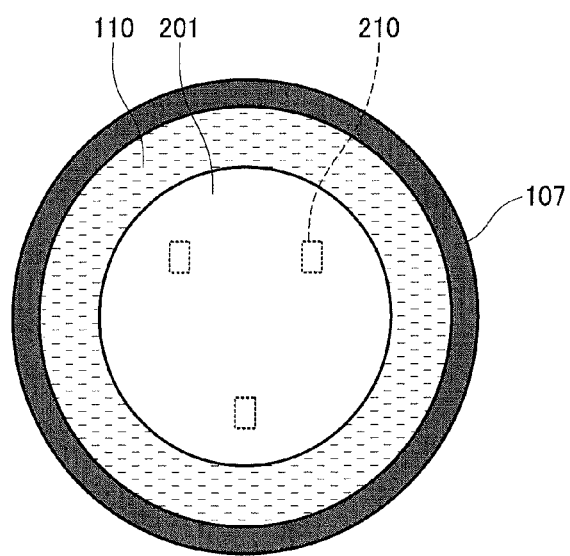
FIG. 6B is a plan view of the portion shown in FIG. 6A.

Yet alternatively, as shown in FIGS. 6A and 6B, three or more small-protrusions 210 may be integrally formed on the bottom in the crucible 107 in a non-collinear manner so as to be made capable of supporting the template 201 with the ends of these small-protrusions 210. The shape of the small-protrusions 210 may be a shown column (a square column as shown, or a circular column or the like), and additionally may be a circular cone, a triangular pyramid, a square pyramid, a semi-sphere or the like. However, the shape of the small-protrusions is not limited to these.

Figure 7:
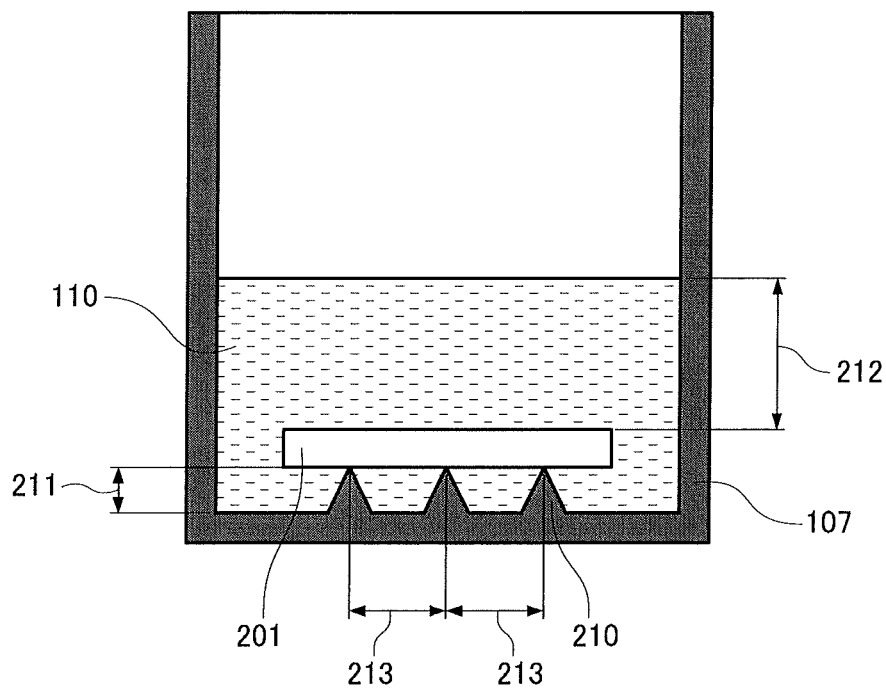
FIG. 7 is a sectional view illustrating a relation between a bottom shape of a crucible usable in the process for producing a group III element nitride single crystal of the embodiment 1 and a raw material liquid.

The height 211 of the protrusion 210 shown in FIG. 7, namely, the distance from the bottom of the crucible 107 to the end of the protrusion 210 is only required to be higher than the height of the raw material liquid 110 (about 0.5 mm) getting into under the template 201 when the bottom of the crucible 107 is flat. Preferably, when the height 211 is 1 mm or higher, the time required to treat the solidified raw material with the treating solution is reduced to a short time and the occurrence of the crystal cracking can be suppressed. More preferably, by using an ultrasonic wave, the raw material having gotten into under the template 201 and having been solidified can be effectively treated. In such a case, the height 211 is preferably larger than half the wavelength of the ultrasonic wave. The frequency of the higher frequency ultrasonic wave is generally about 200 kHz, and accordingly, when such an ultrasonic wave is used, the height 211 is preferably 2 mm or more.

In the case where a plurality of the ridge-shaped protrusions 210 are formed, when the period 213 (the pitch of the positions supporting the template 201) of the protrusions 210 is 1 mm or more, the treatment time can be reduced to half as compared to the case where the period 213 is less than 1 mm. Alternatively, when the period 213 is a distance equal to or less than the radius of the template 201, the template 201 can be always supported with two or more lines of the protrusions 210, and hence an inclined disposition of the template 201 can be prevented.

The amount of the raw material liquid 110 is preferably such that the distance 212 from the surface of the template 201 to the surface of the raw material liquid 110 is 5 mm or more. When the distance 212 is less than 5 mm, the dissolved amount of the raw material gas 109 in the raw material liquid 110 in the vicinity of the surface of the template 201 is increased, the crystal growth on the template 201 cannot meet the dissolution rate of the raw material gas 109, and inferior crystals are generated in the boundary between the crucible 107 and the raw material liquid 110.

Figure 8:
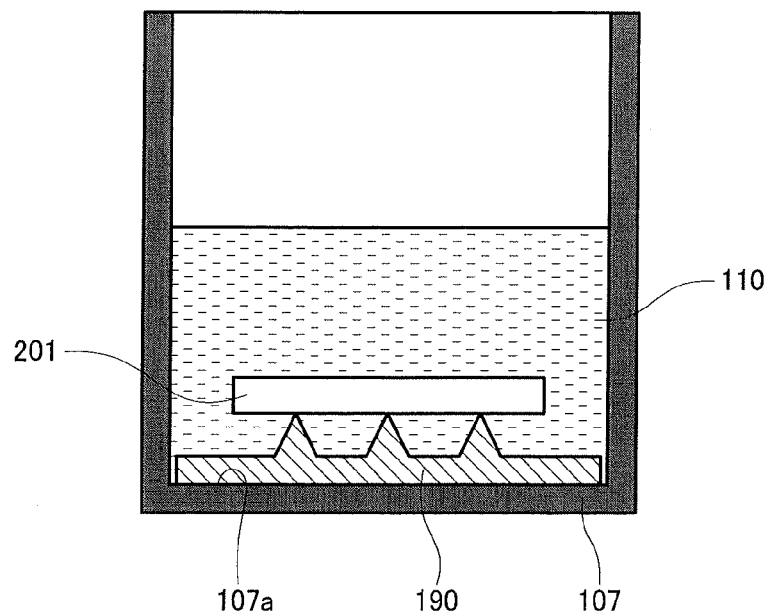
FIG. 8 is a sectional view illustrating a configuration of a crucible, equipped with a spacer, usable in the process for producing a group III element nitride single crystal of the embodiment 1.
Figure 9:
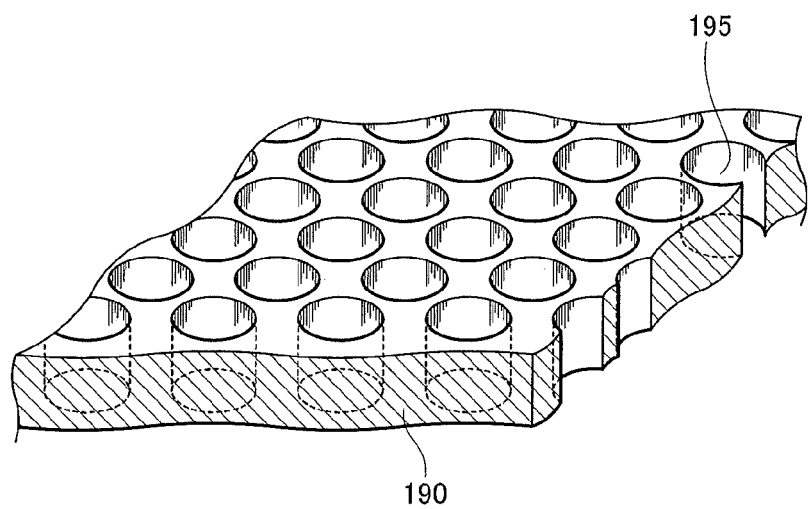
FIG. 9 is a view illustrating another spacer usable in the process for producing a group III element nitride single crystal of the embodiment 1.

Examples of the process for forming the protrusions 210 in the crucible 107 include: a process in which the recesses are formed in the mold for forming the crucible 107; and a process in which the protrusions are formed by cutting in the crucible 107 having a flat bottom. Alternatively, similar effects can also be achieved by disposing as shown in FIG. 8 a plate-shaped spacer 190 having the protrusions 210 on the flat bottom 107a of the crucible 107, or by disposing as shown in FIG. 9 a plate-shaped spacer 190 having a large number of through-holes 195.

Hereinafter, a specific example of the process for producing a group III element nitride crystal of the present invention is described.

Figure 10A:
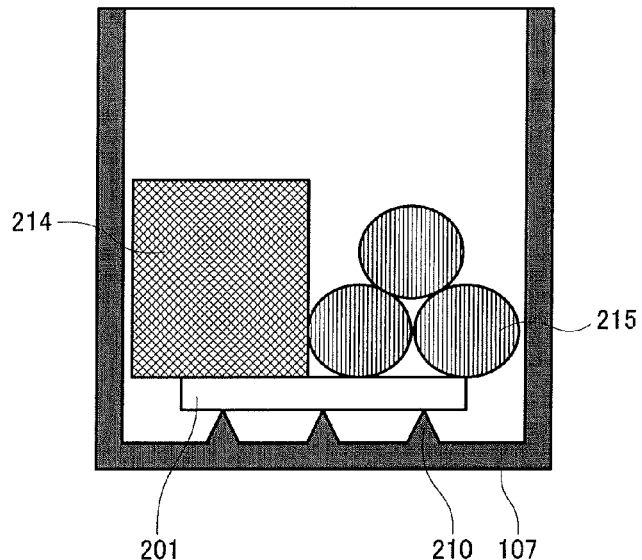
FIG. 10A is a sectional view illustrating a part of the steps of the process for producing a group III element nitride single crystal of the embodiment 1.

As the pressure-resistant heat-resistant vessel 103 shown in FIG. 1, a stainless steel vessel formed of SUS 316 in terms of the JIS material symbols was prepared. As the crucible 107, a crucible of 70 mm in inner diameter and 50 mm in depth, made of an alumina material (purity: 99.99%) was prepared. The crucible 107 was designed to have three protrusions 210 (circular cones of 3 mm in height) arranged on the bottom thereof in a non-collinear manner as shown in FIG. 10A, namely, in a manner such that the ends of the three protrusions 210 formed a plane. For comparison, another crucible 107 was prepared which was formed in the same manner as the crucible 107 shown in FIG. 10A except that neither protrusions nor recesses were disposed on the bottom of the crucible as shown in FIG. 10B.

As the template 201, a template was prepared according to the following manner: a sapphire substrate of 2 inches (51 mm) in diameter was heated to from 1020° C. to 1100° C., and then trimethyl gallium (TMG) and ammonia ($NH_3$) were fed to the atmosphere, and thus a semiconductor layer composed of GaN was formed as a film on the substrate. As the raw material shown in either of FIGS. 10A and 10B, gallium was prepared as the group III element material 215 and sodium was prepared as the alkali metal 214. As the raw material gas 109 shown in FIG. 1, nitrogen gas was prepared.

Figure 10B:
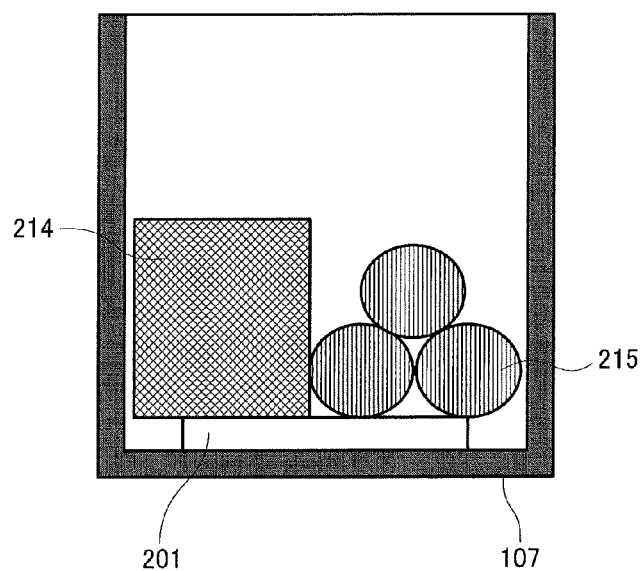
FIG. 10B is a sectional view illustrating a case where the same part of the steps as in FIG. 10A is performed with a crucible having a bottom shape different from the bottom shape of the crucible of the present invention.

Then, in a glove box, the template 201 was disposed in the crucible 107 so as to be parallel to the bottom of the crucible 107 as shown in FIGS. 10A and 10B, 30 g of sodium as the alkali metal 214 and 30 g of gallium as the group III element material 215 were placed on the template 201. Then, the crucible 107 was inserted into the pressure-resistant heat-resistant vessel 103 shown in FIG. 1, the lid 104 was closed, the stop valve 105 was closed, and subsequently the pressure-resistant heat-resistant vessel 103 was taken out from the glove box.

The air in the glove box had been replaced with argon gas, and the glove box was capable of controlling the moisture content and the oxygen concentration. The moisture content is preferably −80° C. or lower in terms of the dew point and the oxygen concentration is preferably 1 ppm or less, and hence the moisture content and the oxygen concentration were controlled so as to satisfy these conditions. In such an environment, when sodium is cut, remarkable discoloration of the cut surface and the like are not observed.

Next, the pressure-resistant heat-resistant vessel 103 was disposed in the growth furnace 100 as shown in FIG. 1, the pressure regulator 102 was set at 40 atm (40 ×$1.01325 \times 10^5$ Pa), and nitrogen gas as the raw material gas 109 was fed to the pressure-resistant heat-resistant vessel 103 from the raw material gas feeder 101.

In this case, the interior of the pressure-resistant heat-resistant vessel 103 was beforehand evacuated to a vacuum of the order of $10^{-2}$ Pa, then the step of injecting the raw material gas 109 into the pressure-tight heat-resistant vessel 103 and replacing the gas in the pressure-resistant heat-resistant vessel 103 with the raw material gas 109 was performed. The pressure-resistant heat-resistant vessel 103 is formed of SUS 316, and hence the interior of the growth furnace 100 was made to be a nitrogen gas atmosphere for the purpose of preventing the oxidation of the pressure-resistant heat-resistant vessel 103.

When the pressure of the interior of the pressure-resistant heat-resistant vessel 103 reached the growth pressure, namely, 40 atm, the growth furnace 100 was heated to the growth temperature, namely, 860° C., thus Ga/Na were mixed together to form the molten raw material liquid 110 in the crucible 107, and the gallium nitride single crystal produced by the reaction between the nitrogen gas dissolved in the raw material liquid 110 and Ga was grown on the template 201. The growth time was set at 100 hours.

On completion of the growth, the pressure-resistant heat-resistant vessel 103 was taken out after cooling from the growth furnace 100, and then the crucible 107 was taken out from the pressure-resistant heat-resistant vessel 103. The raw material liquid 110 taken out from the growth furnace 100 was solidified by cooling to result in a condition that the template 201 was embedded, together with the single crystal, inside the solidified raw material liquid 110. Accordingly, for the purpose of taking out the gallium nitride single crystal, the solidified raw material 110a in the crucible 107 was treated.

Figure 11A:
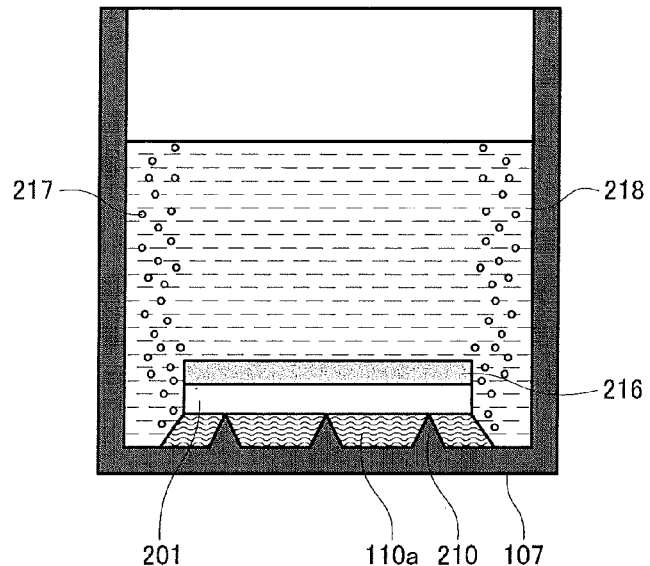
FIG. 11A is a sectional view illustrating another part of the steps of the process for producing a group III element nitride single crystal of the embodiment 1.
Figure 11B:
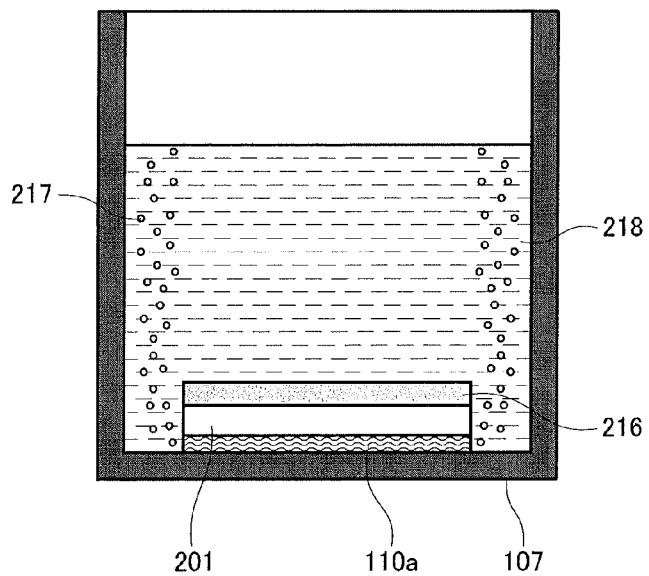
FIG. 11B is a sectional view illustrating a case where the same part of the steps as in FIG. 11A is performed with the crucible of FIG. 10B.

When the solidified raw material 110a was treated, ethanol 218 was injected into the crucible 107 in such a way that the solidified raw material 110a was immersed in ethanol 218 as shown in FIGS. 11A and 11B. It is to be noted that the crucible 107 may also be immersed in ethanol 218. Following the reaction between the solidified raw material 110a and ethanol 218, hydrogen gas 217 was generated. When the hydrogen gas 217, generated following the reaction between the raw material liquid 110 around the template 201 with the single crystal 216 formed thereon and the solidified raw material 110a, came to be scarcely generated, the reaction concerned was promoted with ultrasonic wave, and when the reaction came to proceed slowly, the treatment of the solidified raw material 110a was further promoted by slowly adding water. In this case, the treatment temperature was maintained at 50° C. or lower, for the purpose of avoiding the cracking of the gallium nitride single crystal 216 caused by the stress exerting on the gallium nitride single crystal 216. When the treatment temperature tended to be raised, ethanol 218 or water was added.

The treatment of the solidified raw material 110a was completed after making sure that the hydrogen gas 217 following the reaction between solidified raw material 110a around the template 201 and ethanol 218 was no longer generated, and the template 201 with the gallium nitride single crystal 216 integrally formed thereon was able to be moved with tweezers. Then, the template 201 (grown single crystal body) was taken out from the crucible 107. Under similar conditions and with similar procedures, the growth of the single crystal 216 and the treatment of the solidified raw material 110a were performed a plurality of times, and an examination was made on the results for the crucibles 107 with the protrusions 210 as shown in FIGS. 10A and 11A and the results for the crucibles 107 without protrusions so as to have a flat bottom shape as shown in FIGS. 10B and 11B.

The gallium nitride single crystal 216 was grown in a thickness of 2 mm during the growth time of 100 hours with any of the crucibles 107 having the shapes shown in FIGS. 10A, 11A, 10B and 11B. When the crucibles 107 having the protrusions 210 on the bottom thereof shown in FIGS. 10A and 11A were used, no cracking occurred in the obtained gallium nitride single crystals 216. On the contrary, when the crucibles 107 having no protrusions on the bottom thereof and having a flat bottom shape, shown in FIGS. 10B and 11B were used, cracking occurred in some pieces of the obtained gallium nitride single crystals 216. The times needed for treating the solidified raw materials 110a in the crucibles 107 were as shown in Table 1.

TABLE 1

| Shape of crucible | Treating time of solidified raw material around template | Treating time of solidified raw material having gotten into under template | Total time |
| --- | --- | --- | --- |
| Protrusions present | About 2 hrs | About 3 hrs | About 5 hrs |
| Protrusions absent | About 2 hrs | About 15 hrs | About 17 hrs |

As shown in Table 1, the solidified raw material on the upper surface of the template 201 was able to be treated in about 2 hours for both of the crucibles 107 having the protrusions 210 on the bottom thereof shown in FIGS. 10A and 11A and the crucibles 107 having no protrusions on the bottom thereof and having a flat bottom shape shown in FIGS. 10B and 11B. However, the treatment times of the solidified raw materials 110a having gotten into under the template 201 were largely different. Specifically, when the crucibles 107 having the protrusions 210 on the bottom thereof were used, the treatment was completed in 3 hours; on the contrary, when the crucibles 107 having no protrusions on the bottom thereof were used, the treatment took a time longer by a factor of 5, namely, 15 hours. The individual treatment times were somewhat varied depending on the effects of the temperature and the like of the treatment environment; however, this tendency remained unchanged.

As is clear from the above-described results, by using the crucible 107 having the protrusions 210 on the bottom thereof, the group III element nitride single crystal 216 was able to be satisfactorily grown, and additionally, the grown single crystal 216 was able to be taken out from the solidified raw material in a short time and in a manner suppressing the cracking of the single crystal 216 due to the gas generated from the solidified raw material.

Embodiment 2

Figure 12:
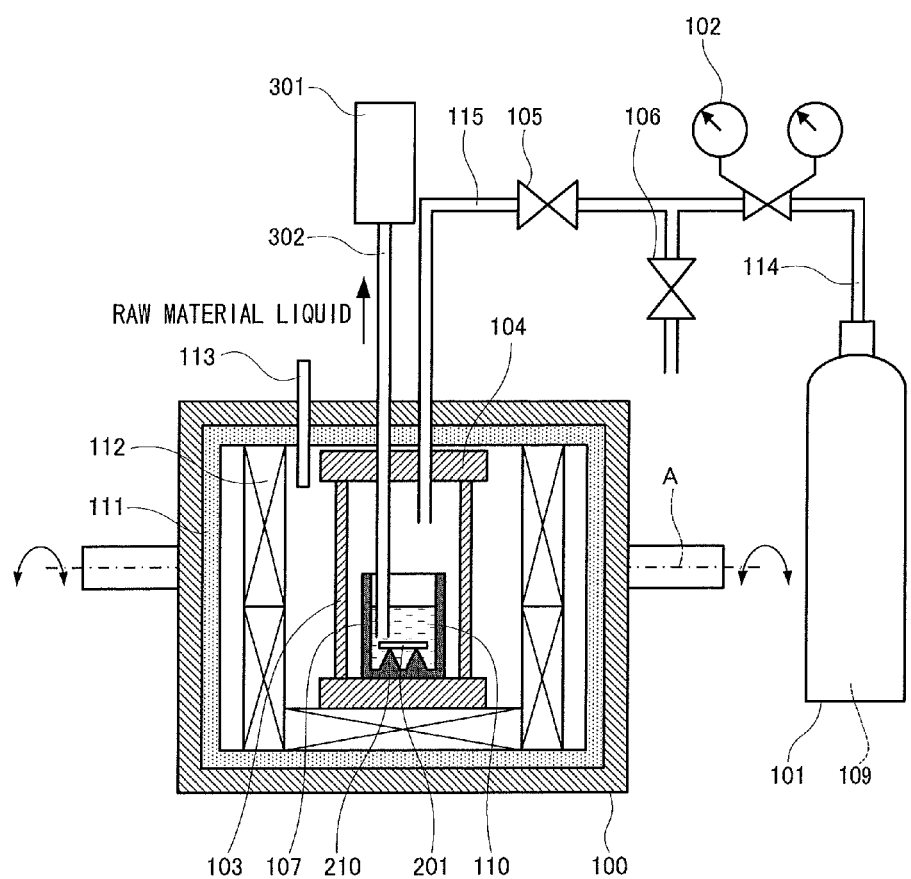
FIG. 12 is a view illustrating a schematic configuration of the apparatus for embodying the process for producing a group III element nitride single crystal of the embodiment 2 of the present invention.

FIG. 12 shows a schematic configuration of the apparatus for embodying the process for producing a group III element nitride single crystal of the embodiment 2 of the present invention. The apparatus of the embodiment 2 is different from the apparatus of the embodiment 1 in that the apparatus of the embodiment 2 is equipped with a raw material liquid discharger 301. The raw material liquid discharger 301 is disposed outside the growth furnace 100, and equipped with a discharge pipe 302. The discharge pipe 302 penetrates through the growth furnace 100 and the air-tight pressure-resistant heat-resistant vessel 103, and extends into the interior of the crucible 107, preferably, to the vicinity of the bottom of the crucible 107. Otherwise the configuration is the same as in the apparatus shown in FIG. 1.

Most of the raw material liquid 110 remaining in the crucible 107 after the completion of the growth of a single crystal is the alkali metal; however, there is a possibility that an alloy between the alkali metal and the group III element material is present. Accordingly, these are melted by actively heating the interior of the growth furnace 100 to a temperature falling in a range from the melting point of the alkali metal to the melting point of the alloy between the alkali metal and the group III element material; and these are sucked and removed, as they are melted, by using the discharge pipe 302. It is to be noted that the raw material liquid 110 can also be removed under the conditions that the interior of the growth furnace 100 is not heated and additionally not actively cooled after the completion of the growth.

For the purpose of satisfactorily performing the above-described operations, in the raw material liquid discharger 301, the discharge pipe 302 preferably has a movable and extensible structure. It is to be noted that when cooling occurs during the discharge of the raw material liquid 110, "agglomeration" may occur, and hence it is preferable to maintain the whole portions brought into contact with the raw material liquid 110, in the raw material liquid discharger 301, at temperatures equal to or higher than a predetermined temperature by disposing heaters or the like in the concerned whole portions.

Specifically, the details are as follows. In the same manner as in Embodiment 1, a single crystal is grown on the template 201, and the raw material liquid 110 in the crucible 107 is treated after the completion of the growth, for the purpose of taking out the single crystal. For that purpose, first the raw material liquid 110 before solidification is discharged through the raw material liquid discharger 301.

In this case, the group III element material remains in an amount of about 5 to 30% of the original amount thereof in the raw material liquid 110 in the crucible 107; however, as described above, there is a possibility that an alloy between the alkali metal and the group III element material is present. Accordingly, the raw material liquid 110 is heated to a temperature falling in a range from the boiling point of the alkali metal to the boiling point of the alloy between the alkali metal and the group III element material, and the raw material liquid 110 is maintained in a liquid state. The preferable heating temperature is 100 to 600° C.

Figure 13:
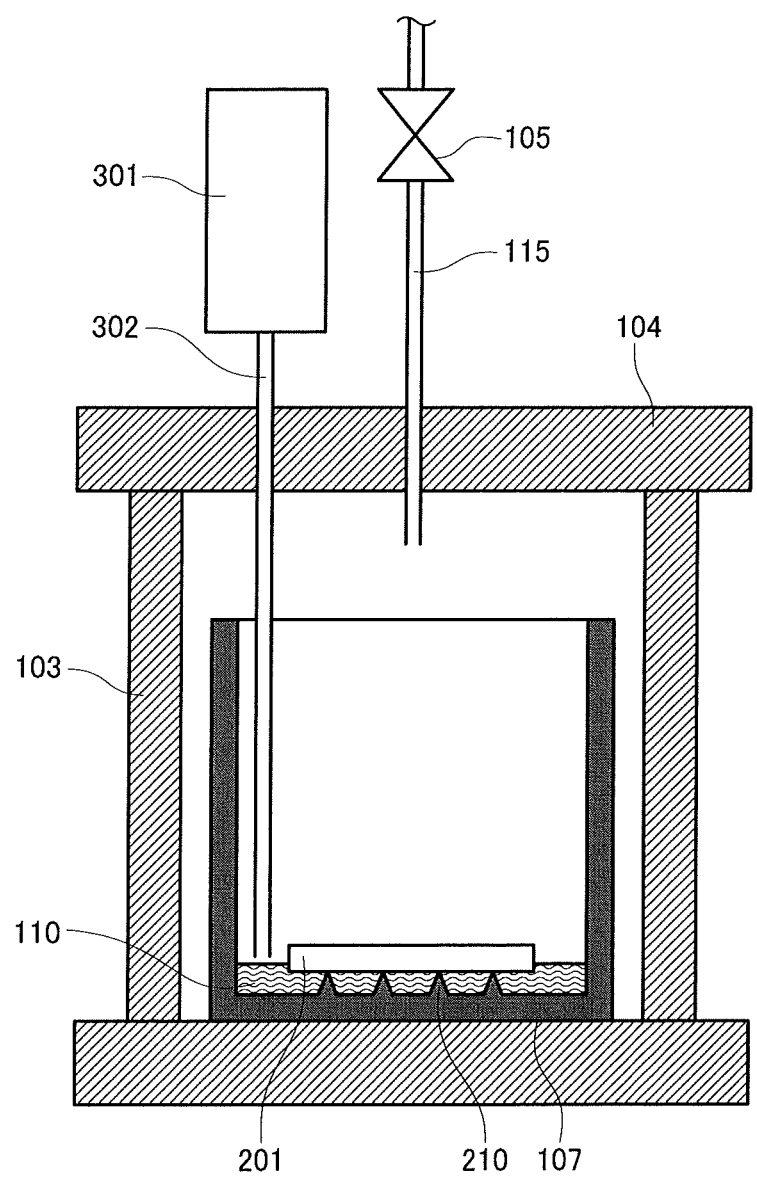
FIG. 13 is a sectional view illustrating a part of the steps of the process for producing a group III element nitride single crystal of the embodiment 2.

In this case, even in the case where the discharge pipe 302 extends close to the bottom of the crucible 107 as described above, when the end of the pipe 302 is located at a position higher than the height of the end of the protrusions 210 in the crucible 107 as shown in FIG. 13, the whole raw material liquid 110 in the crucible 107 cannot be sucked and removed, and hence the raw material liquid 110 remains under the template 201. In such a case, the raw material liquid 110 is treated with ethanol or the like according to the same procedures as in Embodiment 1.

Figure 14:
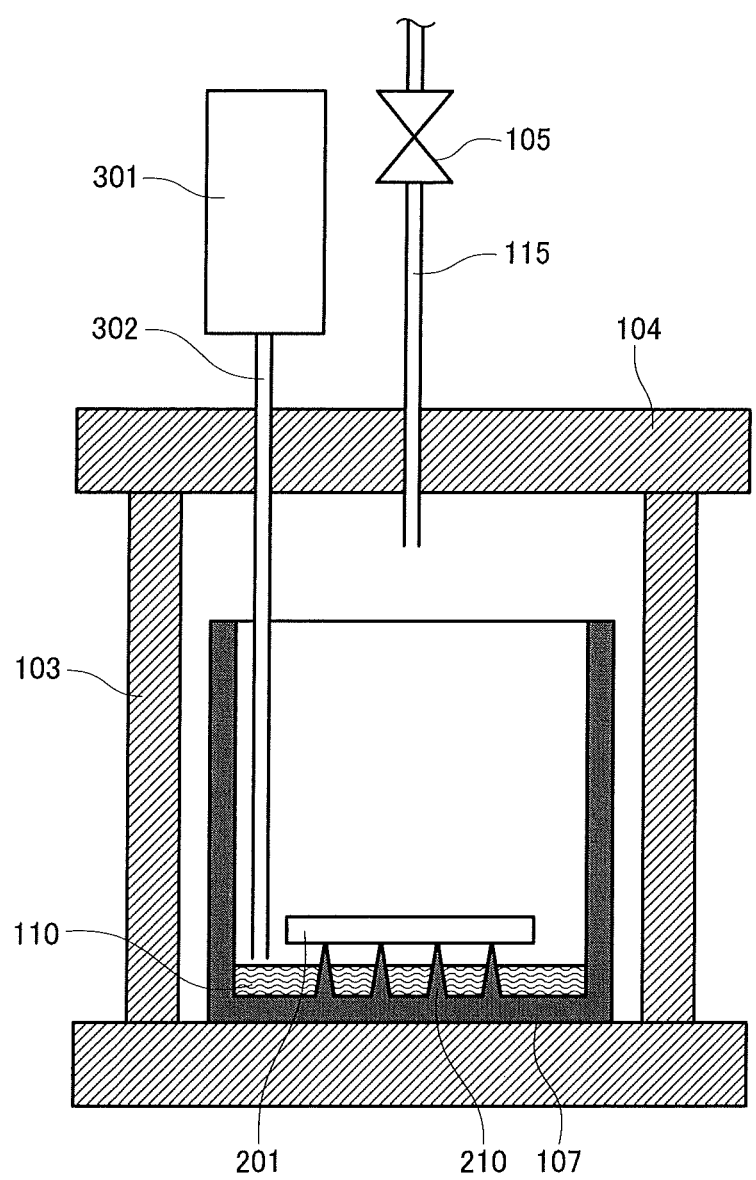
FIG. 14 is another sectional view illustrating a part of the steps of the process for producing a group III element nitride single crystal of the embodiment 2.
Figure 15:
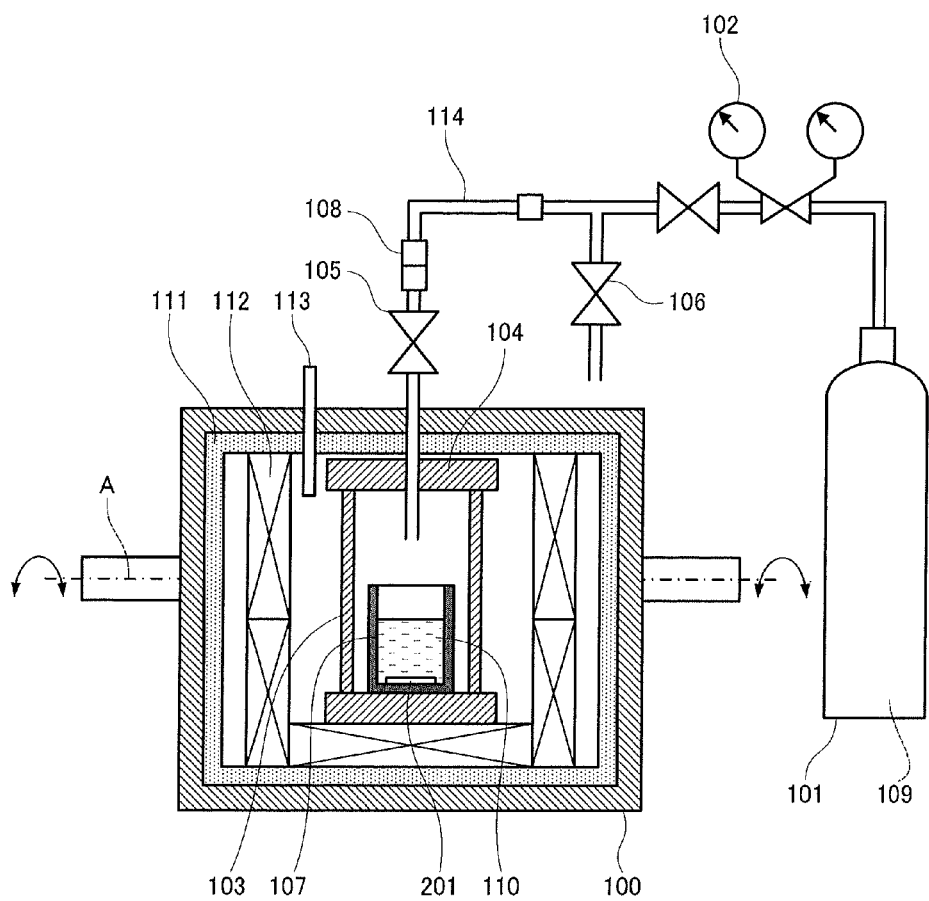
FIG. 15 is a view illustrating a schematic configuration of a known apparatus for embodying a process for producing a group III element nitride single crystal.

As shown in FIG. 14, when the end of the discharge pipe 302 is located at a position lower than the height of the end of the protrusions 210 of the crucible 107, it can be accepted, in principle, that all the raw material liquid 110 in contact with the template 201 can be sucked and removed. However, the raw material liquid 110 adheres to the underside of the template 201 through the surface tension as the case may be. In such a case, according to the same procedures as in Embodiment 1, the raw material liquid 110 is treated with ethanol or the like. When the template 201 comes to be movable with tweezers by performing the treatment, it is recognized that the raw material liquid 110 does not adhere to the underside of the template 210 and the treatment of the raw material liquid 110 is completed, and the template 201 is taken out as it is. In any of the above-described cases, the presence of the protrusions 210 in the crucible 107 enhances the suction and removal effects due to the discharge pipe 302.

In any case, after the completion of the treatment of the raw material liquid 110, the substrate with a single crystal formed on the template 201 (grown single crystal body) is taken out from the crucible 107.

According to the above-described process, the step of sucking and removing the raw material liquid 110 is included, and hence the treatment of the raw material liquid 110 can be performed more easily and in a shorter time as compared to Embodiment 1.

Consequently, according to the process of Embodiment 2, a single crystal can be satisfactorily grown similarly to Embodiment 1, and additionally, the grown single crystal can be taken out from inside the raw material liquid in a short time with the suppression of the cracking of the single crystal due to the gas generated from the raw material liquid.

Industrial Applicability

The process for producing a group III element nitride crystal according to the present invention has an advantage that the grown single crystal can be taken out from the raw material liquid in a short time with suppression of the cracking of the single crystal, and is useful for the production of gallium nitride and the like.

The invention claimed is:

1. A process for producing a group III element nitride single crystal wherein:
   (a) a template, a group III element material and one of an alkali metal and an alkali earth metal are placed in a crucible, and a raw material gas is fed into the crucible;
   (b) by heating an interior of the crucible, the group III element material and one of the alkali metal and the alkali earth metal are liquefied to produce a raw material liquid, and the template is immersed in the raw material liquid;
   (c) the raw material liquid and the raw material gas are reacted with each other to grow a group III element nitride single crystal on the template in the raw material liquid;
   (d) the raw material liquid remaining after completion of the growth of the single crystal, other than liquid that adheres to the template through surface tension, is sucked and removed, and the remaining raw material liquid is cooled and solidified to be a solidified raw material;
   (e) by feeding a hydroxyl group-containing solution into the crucible containing the solidified raw material after the raw material liquid is sucked and removed in (d), the solidified raw material is removed from around the template, and thus the group III element nitride single crystals taken out from inside the solidified raw material;
   (f) said process comprises disposing the template at a position away from a bottom of the crucible; and
   (g) the raw material liquid is sucked and removed in (d) so that a height of at least one portion of a surface of the remaining raw material liquid becomes lower than a height of the position at which the template is placed for growing the group III element nitride single crystal.

2. The process for producing a group III element nitride single crystal according to claim 1, supporting the template with protrusions formed on a bottom of the crucible.

3. The process for producing a group III element nitride single crystal according to claim 1, supporting the template with a spacer disposed between the bottom of the crucible and the template.

4. The process for producing a group III element nitride single crystal according to claim 1, supporting the template so as to take a position parallel to the bottom of the crucible.

5. The process for producing a group III element nitride single crystal according to claim 1, disposing the template at a position 1 mm or more away from the bottom of the crucible.

6. The process for producing a group III element nitride single crystal according to claim 1, setting a distance between an upper surface of the template and a surface of the raw material liquid at 5 mm or more.

* * * * *